(12) United States Patent
Moll et al.

(10) Patent No.: US 6,924,209 B2
(45) Date of Patent: Aug. 2, 2005

(54) METHOD FOR FABRICATING AN INTEGRATED SEMICONDUCTOR COMPONENT

(75) Inventors: Hans-Peter Moll, Dresden (DE); Alexander Trueby, Dresden (DE); Andreas Wich-Glasen, Langebrueck (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/416,674

(22) PCT Filed: Oct. 17, 2001

(86) PCT No.: PCT/EP01/12034

§ 371 (c)(1),
(2), (4) Date: Oct. 16, 2003

(87) PCT Pub. No.: WO02/41399

PCT Pub. Date: May 23, 2002

(65) Prior Publication Data

US 2004/0058509 A1 Mar. 25, 2004

(30) Foreign Application Priority Data

Nov. 14, 2000 (DE) .......................................... 100 56 261

(51) Int. Cl.⁷ .............................................. H01L 21/76
(52) U.S. Cl. ...................... 438/424; 438/425; 438/426; 438/435; 438/439; 438/692; 438/928; 438/976
(58) Field of Search ................................ 438/421, 422, 438/424, 425, 426, 435, 439, FOR 221, FOR 227, 692, 928, 976

(56) References Cited

U.S. PATENT DOCUMENTS

| | | | |
|---|---|---|---|
| 4,687,682 A | | 8/1987 | Koze |
| 4,732,869 A | * | 3/1988 | van Attekum et al. ...... 438/449 |
| 4,789,560 A | * | 12/1988 | Yen .............................. 427/96 |
| 5,319,570 A | * | 6/1994 | Davidson et al. .............. 716/4 |
| 5,406,109 A | * | 4/1995 | Whitney ...................... 257/467 |
| 5,459,104 A | * | 10/1995 | Sakai .......................... 437/225 |
| 5,981,353 A | * | 11/1999 | Tsai ........................... 438/424 |
| 6,037,018 A | | 3/2000 | Jang et al. |
| 6,054,365 A | * | 4/2000 | Lizotte ....................... 438/430 |
| 6,057,207 A | | 5/2000 | Lin et al. |
| 6,057,210 A | | 5/2000 | Yang et al. |
| 6,090,714 A | | 7/2000 | Jang et al. |
| 6,103,581 A | | 8/2000 | Lin et al. |
| 6,133,114 A | | 10/2000 | Lu et al. |
| 6,387,764 B1 | * | 5/2002 | Curtis et al. ................. 438/296 |
| 2002/0037626 A1 | * | 3/2002 | Muth ......................... 438/404 |

FOREIGN PATENT DOCUMENTS

| | | | | |
|---|---|---|---|---|
| EP | 0 905 756 | | 3/1999 | |
| JP | 10032241 A | * | 2/1998 | ......... H01L/21/762 |

* cited by examiner

*Primary Examiner*—George Fourson
*Assistant Examiner*—Michelle Estrada
(74) *Attorney, Agent, or Firm*—Schiff Hardin LLP

(57) ABSTRACT

A method for the fabrication of an integrated semiconductor component, in which at least one isolation trench is formed, a first layer of a nonconductive material is applied by a nonconformal deposition method, and a second layer of a nonconductive material is applied by a conformal deposition method at least to the back surface of the semiconductor component.

18 Claims, 2 Drawing Sheets

METHOD FOR FABRICATING AN INTEGRATED SEMICONDUCTOR COMPONENT

BACKGROUND OF THE INVENTION

The invention relates to a method for the fabrication of an integrated semiconductor component.

Integrated semiconductor components are fabricated by forming integrated circuits on semiconductor wafers. The integrated circuits are conductively connected internally and externally to the semiconductor wafer, with the result that structured conductive layers are formed, which in turn are separated from one another by dielectric layers. To ensure that the components are able to function perfectly, the individual active elements of the integrated circuits have to be isolated from one another. This is achieved by what are known as isolation trenches which are formed in the semiconductor wafer and are then filled with a nonconductive material to form what is known as a shallow trench isolation or STI. Hitherto, the step of filling with nonconductive material has usually been carried out by conformal deposition of an isolation layer, i.e. by deposition of isolation material at the same rate overall the accessible surfaces. As a result, a layer of uniform thickness is formed on the semiconductor component.

In recent years, the complexity of integrated circuits has increased considerably, while at the same time the size of the circuits has decreased drastically. For this reason, the isolation trenches which are required in order to separate the individual active elements have been formed with an increasingly great aspect ratio. However, conventional conformal deposition processes can no longer be used to fill these isolation trenches with a high aspect ratio, since the deposition of isolation material on the walls of the isolation trench closes off the trench before it has been completely filled. The cavities which are formed in this way prevent optimum isolation properties from being achieved.

With increasing complexity for new technological shrinks and the associated increasing aspect ratio of the isolation trenches, therefore, nonconformal filling processes have become increasingly important for filling the isolation trenches. In these nonconformal filling processes, isolation material is deposited at different rates on different surfaces of the semiconductor component, with the result that isolation layers of different thicknesses are deposited on the semiconductor component. Since the isolation material is deposited more quickly at the bottom of the isolation trenches than on the walls of the trenches, the isolation trenches are filled with the isolation material without cavities being formed. The remaining structures of the semiconductor component are likewise covered by an isolation layer (see FIG. 1).

When using these nonconformal filling processes, the problem arises that there is no sealing of the wafer back surface. However, if there is no back surface seal, there is a risk that, during subsequent thermal processes, materials, such as for example dopants, will escape from the back surface of the wafer and will be deposited on the adjoining wafer, since the wafers are usually subjected to the thermal processes while they are standing in pits. This may affect further process steps and also the electrical functionality of the integrated circuit. In particular, the threshold voltage, leakage currents and GOX (gate oxide regions) reliability are problem sources which need to be mentioned.

SUMMARY OF THE INVENTION

Therefore, the present invention is based on the object of providing a method for the fabrication of integrated semiconductor components in which optimum isolation properties of the isolation trenches are achieved and, at the same time, the wafer back surface is sealed.

This object is achieved by the method for fabricating an integrated semiconductor component, which comprises the steps of forming at least one isolation trench on a front surface of the semiconductor component, applying a first layer of a nonconductive material using a nonconformal deposition method on the front surface, and applying a second layer of a nonconductive material using a conformal deposition method at least to the back surface of the semiconductor component.

Therefore, in the method according to the invention, after the isolation trench has been filled using a nonconformal deposition method, an additional deposition step is carried out. This step is used to seal the back surface of the semiconductor component. This prevents materials, such as for example dopants, from diffusing out of the back surface in subsequent thermal process steps required for treatment of the semiconductor component. The greater tendency to outdiffusion which is present at elevated temperatures on account of the temperature-dependent vapor pressure of these materials is prevented by the back surface sealing.

According to a preferred embodiment of the present invention, the isolation trench is between 5000 and 10,000 angstrom deep, preferably between 6000 and 8000 angstrom deep.

In addition, embodiments have the first layer of a nonconductive material being applied in a thickness of between 1000 and 4000 angstrom, and preferably a thickness of between 2000 and 3000 angstrom.

According to very particularly preferred embodiments of the present invention, the second layer of a nonconductive material is applied in a thickness of between 1000 and 5000 angstrom, and preferably a thickness of between 2000 and 4000 angstrom.

Preferred nonconformal methods for the deposition of the first layer of nonconductive material are high-density plasma chemical vapor deposition (HDP-CVD) or a Selox (selective oxide) process, while preferred conformal methods for the deposition of the second layer of nonconductive material are atmospheric pressure thermal chemical vapor deposition (APCVD), sub-atmospheric pressure thermal chemical vapor deposition (SACVD) or low-pressure chemical vapor deposition (LPCVD).

Silicon oxide is used as the preferred nonconductive material for filling the isolation trenches and for sealing the back surface of the semiconductor component. Tetraethyl orthosilicate (TEOS) is the preferred Si source for application of the nonconductive layers.

An embodiment of the present invention according to which the second layer of a nonconductive material, which is applied by a conformal deposition method, is also applied to the front surface of the semiconductor component is very particularly preferred. Firstly, this further complements the filling of the isolation trenches, and secondly the topology-dependent thickness of the isolation layer is made more even.

According to a very particularly preferred embodiment of the present invention, chemical mechanical polishing (CMP) is carried out as an additional step after the application of the second layer of a nonconductive material. If the second layer, which is applied by the conformal deposition method, is also applied to the front surface of the integrated semiconductor component, the result is the particular advantage that polish-only CMP techniques can be used because of the previous evening of the thickness of the layer of nonconductive material.

The invention is explained in more detail below with reference to FIGS. 1 to 3.

DESCRIPTION OF EMBODIMENTS OF THE INVENTION

Figure 1:
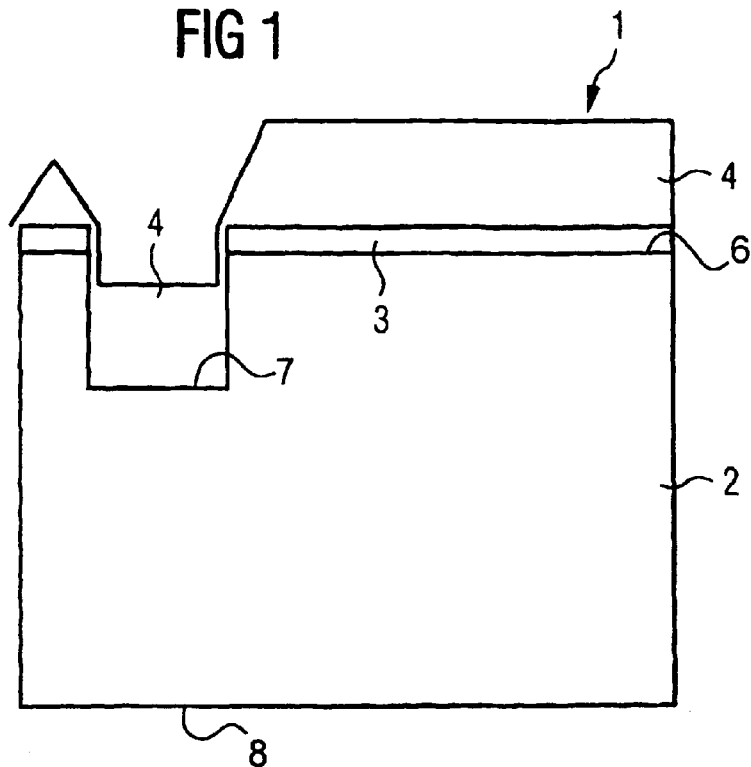
FIG. 1 is a diagrammatic cross-sectional view through a semiconductor component having a first layer of a nonconductive material which has been applied using a nonconformal deposition method to fill an isolation trench on a front surface of the component.

FIG. 1 diagrammatically depicts a cross section through a semiconductor component 1 which is known from the prior art and comprises a semiconductor layer 2 having a front surface 6 with a pad of a nitride layer 3 and an isolation trench 7. The component 1 also has a first layer 4 of a nonconductive material, which has been applied using a nonconformal deposition method. The back surface 8 of the semiconductor component 1 is not sealed by the nonconformal deposition method.

Figure 2:
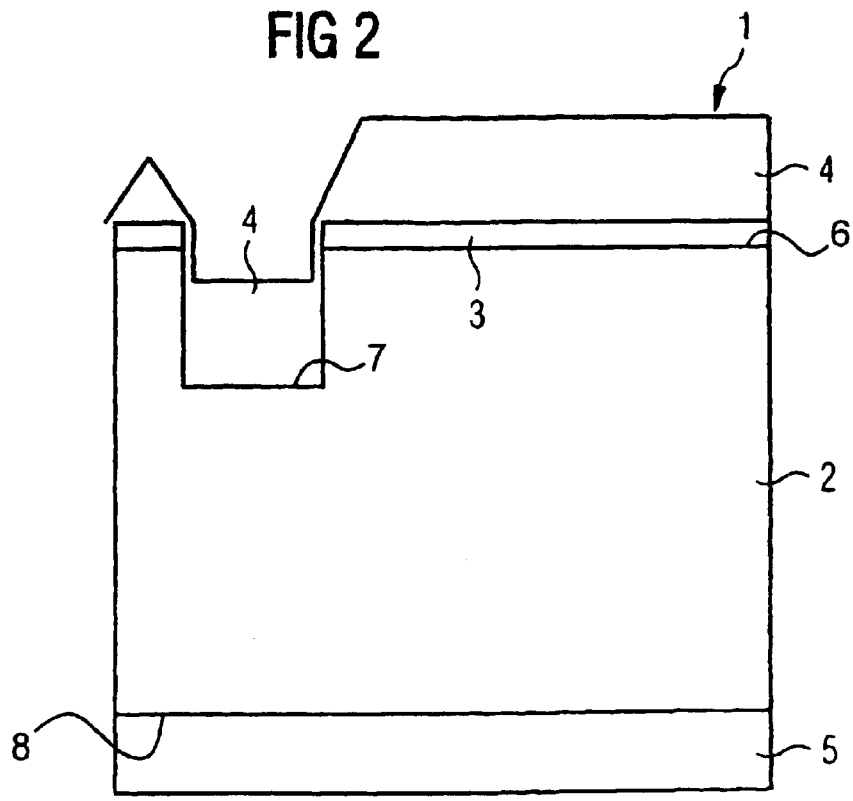
FIG. 2 is a diagrammatic cross-sectional view through a semiconductor component having a second layer of a nonconductive material which has been applied to the back surface of the semiconductor component using a conformal deposition method.

FIG. 2 diagrammatically depicts a cross section through a semiconductor component 1 comprising a semiconductor layer 2, a pad formed by a nitride layer 3, a first or isolation layer 4 of a nonconductive material which has been applied using a nonconformal deposition method to fill the isolation trench 7 and a second layer 5 of a nonconductive material which has been applied to the back surface 8 of the semiconductor component 1 using a conformal deposition method. The back surface 8 of the semiconductor component is also sealed by the additional deposition step.

Figure 3:
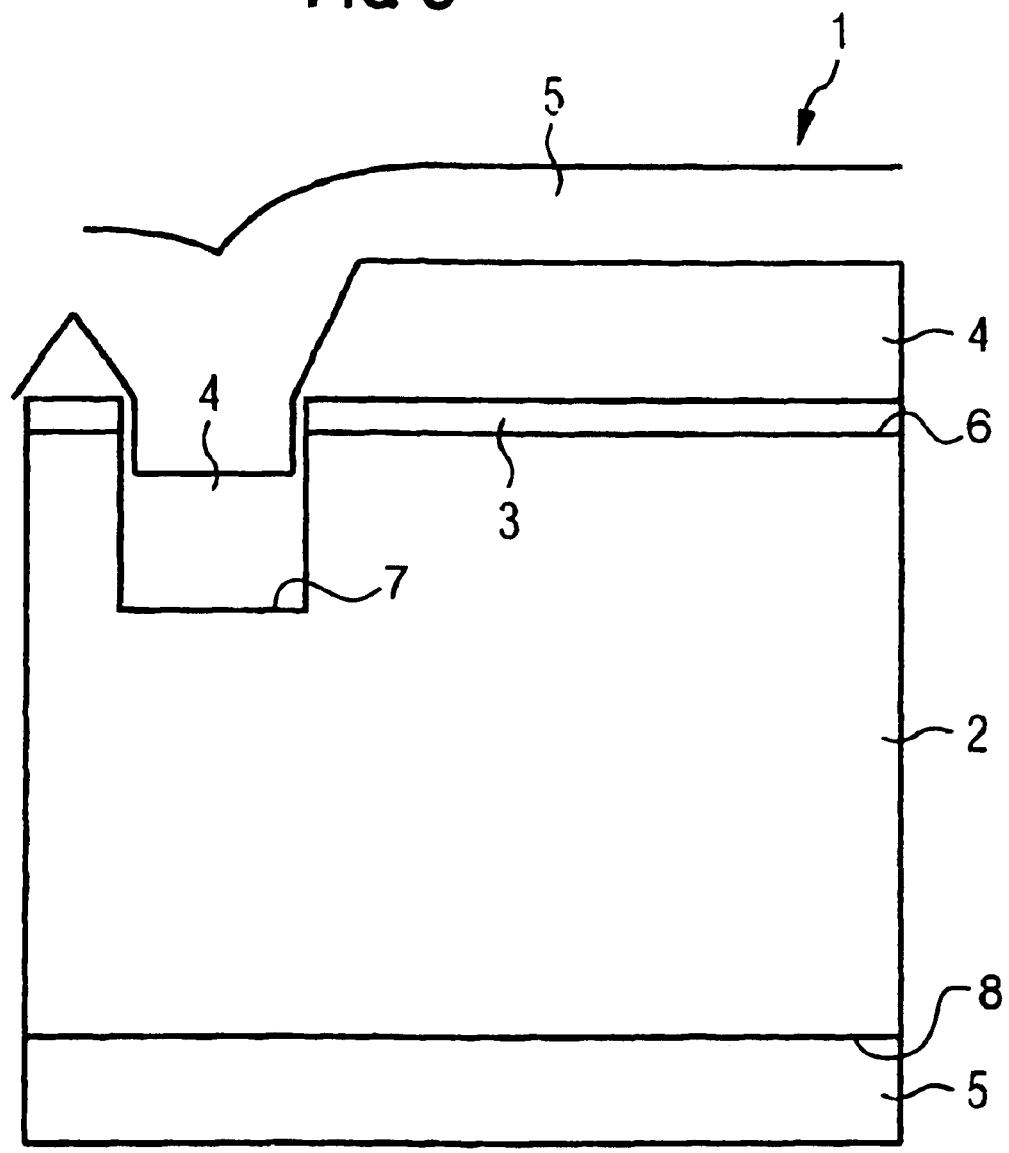
FIG. 3 is a diagrammatic cross-sectional view through a semiconductor component having a second layer of a nonconductive material which has been applied to the first layer on the front surface of the semiconductor component and on the back surface by using a conformal deposition method.

FIG. 3 diagrammatically depicts a cross section through a semiconductor component 1, comprising a semiconductor layer 2, a pad of a nitride layer 3, a first layer 4 of a nonconductive material, which has been applied using a nonconformal deposition method to fill the isolation trench 7, and a second layer 5 of a nonconductive material, which has been applied using a conformal deposition method. In this embodiment, the layer 5 has been applied not only to the back surface 8 of the integrated semiconductor component, but also to the first layer 4 on the front surface 6 of this component. The additional deposition step, as well as sealing the back surface 8 of the semiconductor component, also further complements the filling of the isolation trenches 7 and compensates for the topology-dependent thickness of the isolation layer 4.

We claim:

1. A method for fabricating an integrated semiconductor component comprising the following steps:
   providing a semiconductor layer having a front side and a back side;
   forming at least one isolation trench in the front side of the semiconductor layer;
   applying a first layer of a non-conductive material of silicon oxide onto the front side of the semiconductor layer using a non-conformal deposition method; and
   applying a second layer of a non-conductive material of silicon oxide by a conformal deposition method onto the front side and back side of the semiconductor layer.

2. A method according to claim 1, wherein the isolation trench has a depth of between 5,000 and 10,000 angstroms.

3. A method according to claim 2, wherein the isolation trench has a depth of between 6,000 and 8,000 angstroms.

4. A method according to claim 2, wherein the first layer of non-conductive material has a thickness of between 1,000 and 4,000 angstroms.

5. A method according to claim 4, wherein the first layer of non-conductive material has a thickness of between 2,000 and 3,000 angstroms.

6. A method according to claim 4, wherein the second layer of non-conductive material has a thickness of between 1,600 and 5,000 angstroms.

7. A method according to claim 6, wherein the second layer of non-conductive material has a thickness of between 2,000 and 4,000 angstroms.

8. A method according to claim 1, wherein the non-conformal method for deposition is selected from a group consisting of high-density plasma chemical vapor deposition (HDP-CVD) and a Selox process.

9. A method according to claim 8, wherein the conformal method for deposition is selected from a group consisting of atmospheric pressure thermal chemical vapor deposition (APCVD), sub-atmospheric pressure thermal chemical vapor deposition (SACVD) and low-pressure chemical vapor deposition (LPCVD).

10. A method according to claim 9, wherein the Si source used during the application of the non-conductive layer is tetraethyl orthosilicate (TEOS).

11. A method according to claim 1, which includes, after the application of the second layer, chemically polishing the second layer.

12. A method according to claim 1, wherein the first layer of non-conductive material has a thickness of between 1,000 and 4,000 angstroms.

13. A method according to claim 12, wherein the first layer of non-conductive material has a thickness of between 2,000 and 3,000 angstroms.

14. A method according to claim 1, wherein the second layer of non-conductive material has a thickness of between 1,000 and 5,000 angstroms.

15. A method according to claim 14, wherein the second layer of non-conductive material has a thickness of between 2,000 and 4,000 angstroms.

16. A method according to claim 1, wherein the conformal method for deposition of the second layer of non-conductive material is selected from a group consisting of atmospheric pressure thermal chemical vapor deposition (APCVD), sub-atmospheric pressure thermal chemical vapor deposition (SACVD) and low-pressure chemical vapor deposition (LPCVD).

17. A method according to claim 16, wherein the Si source used during the application of the non-conductive layer is tetraethyl orthosilicate (TEOS).

18. A method according to claim 1, wherein the second layer of non-side conductive material seals the back side of the semiconductor layer.

* * * * *